United States Patent
Takeda et al.

(10) Patent No.: US 8,331,182 B2
(45) Date of Patent: Dec. 11, 2012

(54) SEMICONDUCTOR DEVICE INCLUDING PLURAL ELECTRODE PADS

(75) Inventors: Hiromasa Takeda, Tokyo (JP); Satoshi Isa, Tokyo (JP); Shotaro Kobayashi, Tokyo (JP); Mitsuaki Katagiri, Tokyo (JP)

(73) Assignee: Elipida Memory, Inc., Tokyo (JP)

( * ) Notice: Subject to any disclaimer, the term of this patent is extended or adjusted under 35 U.S.C. 154(b) by 0 days.

(21) Appl. No.: 12/881,786

(22) Filed: Sep. 14, 2010

(65) Prior Publication Data

US 2011/0063936 A1 Mar. 17, 2011

(30) Foreign Application Priority Data

Sep. 15, 2009 (JP) ................. 2009-213112

(51) Int. Cl.
*G11C 7/06* (2006.01)
(52) U.S. Cl. ...................... 365/207; 365/205
(58) Field of Classification Search .................. 365/205, 365/207, 51, 52
See application file for complete search history.

(56) References Cited

U.S. PATENT DOCUMENTS 5,880,531 A * 3/1999 Hagiya et al. ................. 257/786
2007/0075440 A1* 4/2007 Osanai et al. ................. 257/786

FOREIGN PATENT DOCUMENTS

JP 2009-038142 2/2009

* cited by examiner

*Primary Examiner* — Hoai V Ho
*Assistant Examiner* — Tri Hoang
(74) *Attorney, Agent, or Firm* — McDermott Will & Emery LLP

(57) ABSTRACT

A semiconductor device includes a pad for sense amplifier ground potential as an electrode pad supplying ground potential voltage to a sense amplifier, a first conductive line connected to the pad for sense amplifier ground potential, and a second conductive line connected to an electrode pad closest to the pad for sense amplifier ground potential among plural electrode pads included in a pad row. The second conductive line extends to the opposite side of the first conductive line with the pad row as a reference.

20 Claims, 5 Drawing Sheets

SEMICONDUCTOR DEVICE INCLUDING PLURAL ELECTRODE PADS

This application is based upon and claims the benefit of priority from Japanese Patent Application No. 2009-213112 filed on Sep. 15, 2009, the content of which is incorporated by reference.

BACKGROUND OF THE INVENTION

1. Field of the Invention

The present invention relates to a semiconductor device including plural electrode pads.

2. Description of the Related Art

A DRAM (Dynamic Random Access Memory) as a type of a memory device includes a cell block in which plural memory cells are arranged and a sense amplifier that amplifies signal indicating information stored in one memory cell selected out of the plural memory cells. Plural electrode pads (hereinafter simply referred to as pads) connected to internal circuits such as the cell block and the sense amplifier are provided on a chip surface of the memory device.

As an example of a package of a semiconductor device including a chip of a memory device, there is a package having a configuration in which pads are connected to bond fingers via wires by wire bonding and the bond fingers are connected to solder balls equivalent to external terminals. The wires that connect the pads and the bond fingers may be called bonding wires to distinguish the wires from a metal wire in the chip. However, in this specification, the wires are simply referred to as wires.

As the pads, there are plural kinds of pads depending on their purposes. A part of the plural kinds of pads is explained below. As the pads, there are a pad for address selection (hereinafter referred to as ADD pad) that receives input of an address signal for selecting one of plural memory cells in a cell block from the outside, a pad for input/output of data (hereinafter referred to as DQ pad), and a pad for sense amplifier ground potential (hereafter referred to as VSSSA pad) as a pad for supplying ground potential voltage (VSSSA) to a sense amplifier. The ADD pad and the DQ pad belong to the category of a signal pad as a pad for at least receiving the input of a signal from the outside of a semiconductor device or for outputting a signal to the outside.

An example of a semiconductor laminate package is disclosed in JP2009-038142A (hereinafter referred to as Patent Document 1). In a chip disclosed in this document, plural pads are arranged side by side in a longitudinal direction of the chip near the center of the chip. The pads are connected to a connection land or a wire expanding portion via wire lines.

When wire bonding is performed in the same direction from the pads of a pad row with the pad row as a reference, the wires respectively connected to the pads adjacent to each other are provided in parallel spaced apart from each other by the distance of a pad interval. When the VSSSA pad is arranged next to the DQ pad, a first wire connected to the VSSSA pad and a second wire connected to the DQ pad extend in parallel spaced apart from each other by the distance of the pad interval.

When noise is caused in the first wire by potential fluctuation in VSSSA, since the first wire and the second wire extend in parallel at the distance of the pad interval, in some case, the noise is propagated to the second wire. In this case, a signal input via the DQ pad is adversely affected. When timing of the occurrence of the noise in the first wire and timing of the input of the signal to the DQ pad coincide with each other, a memory device is likely to misrecognize a high level of a DQ signal as a low level or misrecognize the low level as the high level.

In the technique disclosed in Patent Document 1, a pad for DQ voltage for ground potential (equivalent to a VSSQ pad) is arranged next to a pad for DQ signal. The direction where the wire line is connected to the pad for DQ signal at a position near the chip center is in the opposite direction to the direction where the wire line is connected to the VSSQ pad also at the position near the chip center. However, Patent Document 1 does not disclose that the VSSSA pad is arranged next to the pad for DQ signal.

SUMMARY

In one embodiment, there is provided a semiconductor device that includes: a pad for sense amplifier ground potential as an electrode pad supplying ground potential voltage to a sense amplifier; a first conductive line connected to the pad for sense amplifier ground potential; and a second conductive line connected to an electrode pad closest to the pad for sense amplifier ground potential among plural electrode pads included in a pad row. The second conductive line extends to the opposite side of the first conductive line with the pad row as a reference.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Semiconductor devices of exemplary embodiments of the present invention are explained. The semiconductor devices explained below in the exemplary embodiments are used as semiconductor storage devices.

First Exemplary Embodiment

Figure 1:
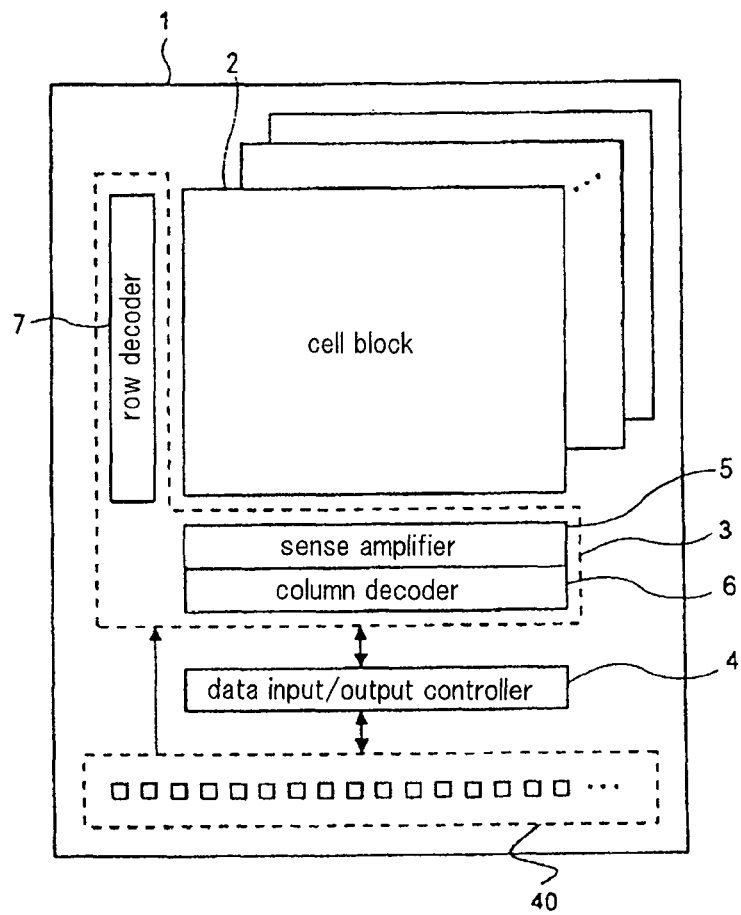
FIG. 1 is a block diagram showing a configuration example of a semiconductor device of a first exemplary embodiment.

The configuration of a semiconductor device of a first exemplary embodiment is explained. FIG. 1 is a block diagram showing a configuration example of a semiconductor device of this exemplary embodiment.

As shown in FIG. 1, semiconductor device 1 includes plural cell blocks 2, read/write controller 3, data input/output controller 4, and pad row 40 including plural electrode pads. Plural memory cells are provided in each of cell blocks 2. Read/write controller 3 includes sense amplifier 5, column decoder 6, and row decoder 7. In FIG. 1, a voltage supply path from pad row 40 to an internal circuit and a path of transmission and reception of signals between pad row 40 and the internal circuit are indicated by arrows. Although not shown in the figure, as an example of a layout, pad row 40 is provided along a longitudinal direction of a chip near the center of the chip and plural cell blocks 2 are arranged on both sides of pad row 40 to be equally arranged in two regions divided by pad row 40.

The configuration of a package mounted with a semiconductor chip, which is a DRAM, is explained. A package substrate which has an insulator is prepared. Solder balls for connection to the outside, bond fingers, and a conductor that connects the bond finger and the solder ball that correspond to each other are provided on the insulator of the package substrate. An opening for exposing a pad row of electrode pads of a DRAM chip is formed in the insulator of the package substrate. The DRAM chip and the package substrate are arranged such that the electrode pads of the DRAM chip are exposed from the opening. The electrode pads of the chip and the bond fingers are connected by conductive lines.

As an example of the conductive lines that connect the electrode pads and the bond fingers, there is the bonding wires explained above. The conductive lines are not limited to the bonding wires and also include printed wires formed of a conductive material such as copper on a thin insulating layer of polyimide or the like. In the following explanation, the conductive lines are used as the bonding wires. The bonding wires are simply referred to as "wires" and the electrode pads are simply referred to as "pads".

Figure 2:
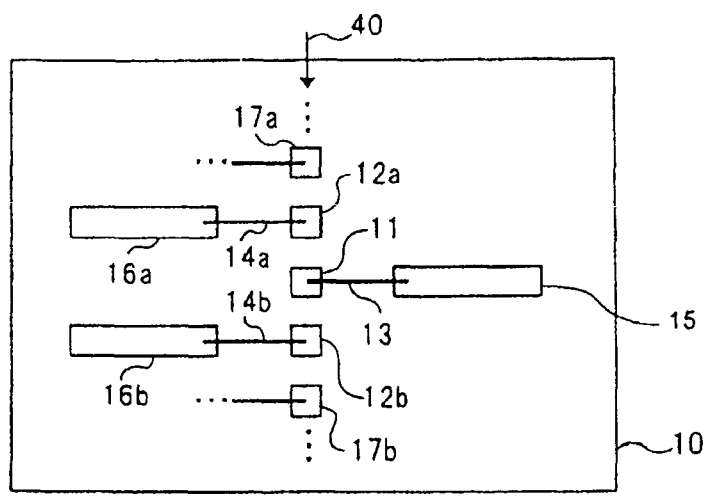
FIG. 2 is a plan view showing a configuration example of a pad row of the semiconductor device shown in FIG. 1.

FIG. 2 is a plan view showing a configuration example of the pad row of the semiconductor device shown in FIG. 1. As shown in FIG. 2, pad row 40 in which plural pads are arranged at predetermined intervals along a fixed direction is provided on the surface of chip 10. Among the plural pads, VSSSA pad 11 is arranged adjacent to signal pads. In the configuration example shown in FIG. 2, the signal pads are DQ pads 12a and 12b.

As explained in the explanation of the configuration of the package, in FIG. 2, an insulator is provided between bond fingers 15, 16a, and 16b and chip 10. However, the insulator is not shown in the figure. The opening for exposing pad row 40 is not shown in the figure. Nor are these components shown in plan views of FIGS. 3 to 9. Explanation of the components is omitted below.

Wire 13 connected to VSSSA pad 11 is connected to bond finger 15 provided on the right side in the figure with respect to pad row 40. On the other hand, wire 14a connected to DQ pad 12a is connected to bond finger 16a provided on the left side in the figure with respect to pad row 40. Wire 14b connected to DQ pad 12b is connected to bond finger 16b provided on the left side in the figure with respect to pad row 40. Wires 14a and 14b extend to the opposite side of wire 13 with pad row 40 as a reference.

Pad 17a next to DQ pad 12a and pad 17b next to DQ pad 12b may be pads of any type except a VSSSA pad. Bond fingers 15, 16a, and 16b are respectively connected to solder balls not shown in the figure. Detailed explanation of bond fingers 15, 16a, and 16b is omitted.

According to this exemplary embodiment, even if a DQ pad and a VSSSA pad are adjacent to each other, a wire connected to the DQ pad and a wire connected to the VSSSA pad are not parallel to each other. Therefore, even if the timing of potential fluctuation of VSSSA and the timing of input and output of DQ overlap, noise that occurs in the wire connected to the VSSSA pad does not affect the wire connected to the DQ pad. It is possible to prevent the device from misrecognizing a high level of a DQ signal as a low level and misrecognizing the low level as the high level.

Besides, as DQ pads, there are a DM pad that receives a signal for setting whether data input is enabled (a signal for masking the data input), a DQS pad that receives a signal as an operation reference of the timing of data input and output (referred to as DQS signal), and a DQSB pad that receives a signal of opposite potential of the DQS signal (referred to as DQSB signal). When any one signal pad among the DM pad, the DQS pad, and the DQSB pad is adjacent to the VSSSA pad in order to prevent malfunction of the memory device, as explained in this exemplary embodiment, the wire connected to the signal pad only needs to be configured to extend to the opposite side of the wire connected to the VSSSA pad with a pad row as a reference.

Example 1

Figure 3:
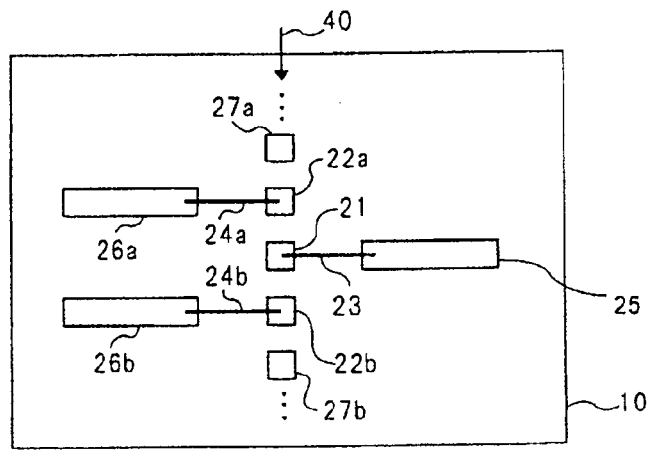
FIG. 3 is a plan view showing a configuration example of a pad row of a semiconductor device of Example 1.

In Example 1, the signal pad adjacent to the VSSSA pad is an ADD pad. FIG. 3 is a plan view showing a configuration example of a pad row of a semiconductor device of this example.

As shown in FIG. 3, pad row 40 is provided on the surface of chip 10. In pad row 40, VSSSA pad 21 and ADD pads 22a and 22b are arranged adjacent to each other. Wire 23 connected to VSSSA pad 21 is connected to bond finger 25 provided on the right side in the figure with respect to pad row 40. On the other hand, wire 24a connected to ADD pad 22a is connected to bond finger 26a provided on the left side in the figure with respect to pad row 40. Wire 24b connected to ADD pad 22b is connected to bond finger 26b provided on the left side in the figure with respect to pad row 40. Wires 24a and 24b extend to the opposite side of wire 23 with pad row 40 as a reference.

Detailed explanation concerning pad 27a next to ADD pad 22a and pad 27b next to ADD pad 22b is omitted. If any one of these pads is the VSSSA pad, a wire extends from a pad row to the right side in the figure. If pads 27a and 27b are pads other than the VSSSA pad, wires connected to these pads may extend in parallel to wire 24a or 24b. Each of bond fingers 25, 26a, and 26b is connected to a solder ball not shown in the figure.

According to this example, even if the ADD pad and the VSSSA pad are adjacent to each other, a wire connected to the ADD pad and a wire connected to the VSSSA pad are not parallel to each other. Therefore, even if the timing of potential fluctuation of VSSSA and the timing of an input address signal overlap, it is possible to prevent nose that occurs in the wire connected to the VSSSA pad from affecting the wire connected to the ADD pad.

The potential fluctuation of VSSSA is also a noise source for a command signal and a control signal input at an operating frequency equal to that of the address signal. When noise is superimposed on a clock signal (CK) as a reference in determining the timing of various input or output signals or a signal having opposite potential of the clock signal (CKB), it is likely that the memory device malfunctions. Therefore, it is necessary to prevent noise due to the potential fluctuation of VSSSA from entering a pad for receiving a command signal (hereinafter referred to as CMD pad), a pad for receiving a control signal (hereinafter referred to as CTRL pad), and a pad for receiving a clock signal (hereinafter referred to as CK pad), and a pad for receiving the signal having opposite potential of the clock signal (hereinafter referred to as CKB pad).

When any one of the signal pads of the CMD pad, the CTRL pad, the CK pad, and the CKB pad is provided adjacent to the VSSSA pad in order to prevent malfunction of the memory device, as explained in this example, the wire connected to the signal pad only has to be configured to extend to the opposite side of the wire connected to the VSSSA pad with the pad row as a reference.

Example 2

In Example 2, a VSSSA pad is adjacent to a constant voltage pad as a pad for supplying constant voltage to a cell block. In the following explanation, the constant voltage is reference voltage (VREF). A pad for supplying reference voltage, which is applied from the outside, to the cell block is hereinafter referred to as VREF pad.

The reference voltage is a voltage lower than power supply voltage (VDD) and has a voltage margin smaller than that of the power supply voltage. Therefore, the reference voltage is substantially affected by noise due to potential fluctuation of VSSSA. When VREF fluctuates exceeding the voltage margin, a memory cell malfunctions.

Figure 4:
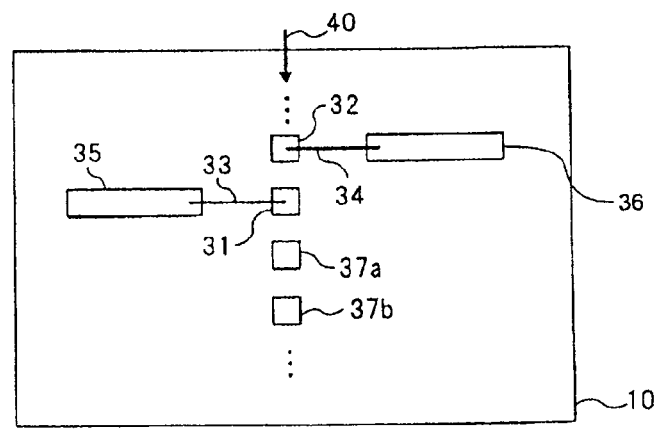
FIG. 4 is a plan view showing a configuration example of a pad row of a semiconductor device of Example 2.

FIG. 4 is a plan view showing a configuration example of a pad row of a semiconductor device of this example. As shown in FIG. 4, pad row 40 is provided on the surface of chip 10. In pad row 40, VREF pad 32 is arranged adjacent to VSSSA pad 31. Wire 33 connected to VSSSA pad 31 is connected to bond finger 35 provided on the left side in the figure with respect to pad row 40.

On the other hand, wire 34 connected to VREF pad 32 is connected to bond finger 36 provided on the right side in the figure with respect to pad row 40. Wire 34 extends to the opposite side of wire 33 with pad row 40 as a reference.

Although detailed explanation concerning pads 37a and 37b is omitted, a wire connected to pad 37a desirably extends from the pad row to the right side in the figure. Each of bond fingers 35 and 36 is connected to a solder ball not shown in the figure.

According to this exemplary embodiment, even if the VREF pad and the VSSSA pad are adjacent to each other, the wire connected to the VREF pad and the wire connected to the VSSSA pad are not in parallel to each other. Therefore, it is possible to prevent noise that occurs in wire 33 because of potential fluctuation of VSSSA from affecting wire 34 connected to the VREF pad.

Example 3

Figure 5A:
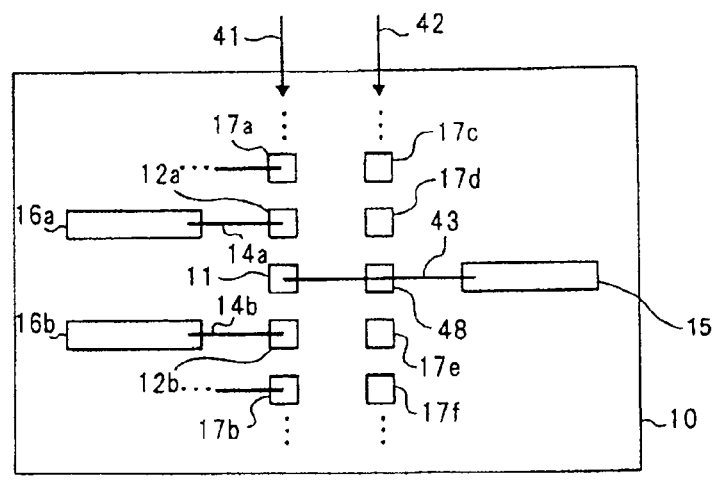
FIG. 5A is a plan view showing a configuration example of pad rows of a semiconductor device of Example 3.

In Example 3, two pad rows are provided in the exemplary embodiment. FIG. 5A is a plan view showing a configuration example of the two pad rows in the semiconductor device of this exemplary embodiment. Pad rows 41 and 42 are provided in parallel to each other on the surface of chip 10 shown in FIG. 5A. As shown in FIG. 5A, pad row 42 is provided on the right side of pad row 41.

In pad row 41, pad 17a, DQ pad 12a, VSSSA pad 11, DQ pad 12b, and pad 17b are arranged in order from the top. In pad row 42, pad 17c, pad 17d, noncontact (NC) pad 48, pad 17e, and pad 17f are arranged in order from the top to correspond to the pads of pad row 41. Pads 17d and 17e are also NC pads.

DQ pad 12a is connected to bond finger 16a via wire 14a. DQ pad 12b is connected to bond finger 16b via wire 14b. Wires 14a and 14b extend to the opposite side of wire 43 with pad row 41 as a reference.

Since NC pad 48 is connected to neither to an internal circuit, nor to a wire, as shown in FIG. 5A, it is possible to connect wire 43 from VSSSA pad 11 to bond finger 15 to extend over NC pad 48. Since each of pads 17d and 17e is also an NC pad, the pad is connected to neither to an internal circuit, nor to a wire. Since NC pad 48 and pads 17d and 17e not are connected to an internal circuit, the pads do not propagate the influence of noise that occurs in wire 43 to the semiconductor device.

Although detailed explanation concerning pads 17c and 17f is omitted, when a wire is connected to each of pads 17c and 17f, the wire extends from pad row 42 to the right side in the figure. In this case, the wire (not shown) connected to each of pads 17c and 17f is parallel to wire 43. However, the distance between the wire and wire 43 is twice as large as a pad interval. Therefore, the influence of noise in wire 43 on the wire connected to each of pads 17c and 17f is negligibly small.

Figure 5B:
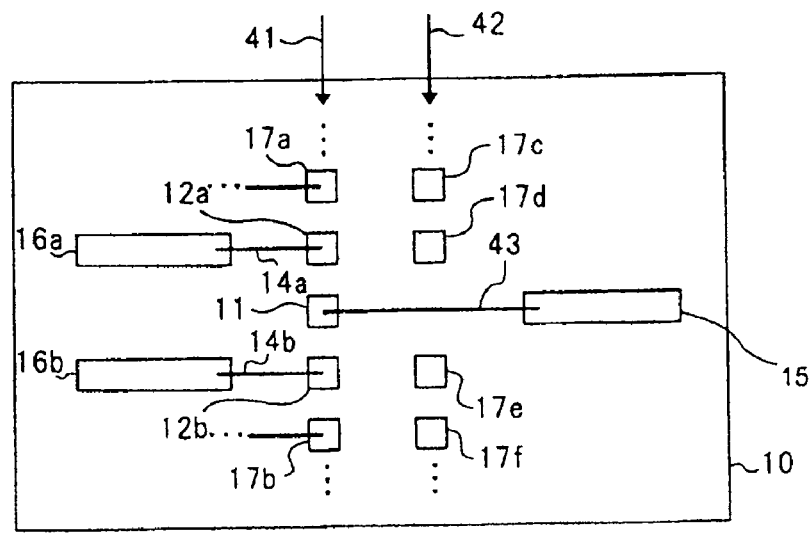
FIG. 5B is a plan view showing another configuration example of the pad rows of the semiconductor device of Example 3.

FIG. 5B is a plan view showing another configuration example of the two pad rows in the semiconductor device of this exemplary embodiment. In chip 10 shown in FIG. 5B, NC pad 48 is not provided in pad row 42 of chip 10 shown in FIG. 5A. As shown in FIG. 5B, a pad does not have to be provided in the position of pad row 42 over which wire 43 extends.

When the two pad rows are provided in the semiconductor device, as in this example, the present invention can also be applied.

In the semiconductor device explained in the first exemplary embodiment and Examples 1 to 3, only the bond finger layout on a package side needs to be changed and a pad layout on a chip side does not need to be changed.

Second Exemplary Embodiment

In a semiconductor device of a second exemplary embodiment, arrangement of a VSSSA pad is shifted from a pad row in which other plural pads are provided. The semiconductor device of this exemplary embodiment includes components that are the same as the components shown in the block diagram of FIG. 1. Detailed explanation of the components is omitted.

Figure 6A:
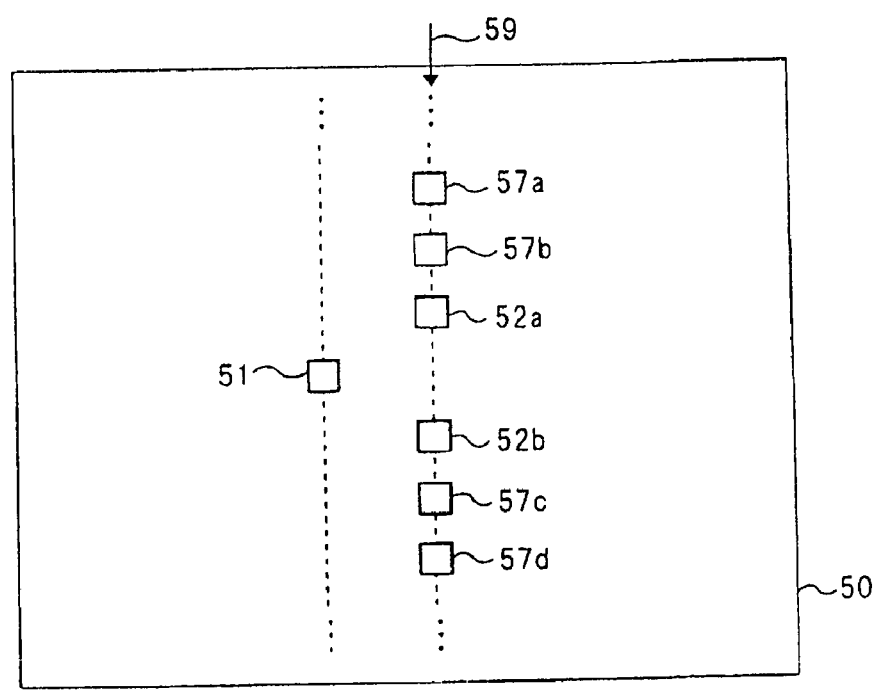
FIG. 6A is a plan view showing a configuration example of pad arrangement of a semiconductor device of a second exemplary embodiment.

Pad arrangement in the semiconductor device of this exemplary embodiment is explained. FIG. 6A is a plan view showing a configuration example of the pad arrangement of the semiconductor device of this exemplary embodiment.

As shown in FIG. 6A, pad row 59 in which plural pads are arranged along a fixed direction at predetermined intervals is provided on the surface of chip 50. In pad row 59 shown in FIG. 6A, pad 57a, pad 57b, DQ pad 52a, DQ pad 52b, pad 57c, and pad 57d are arranged in order from the top. However, DQ pads 52 and 52b are spaced apart at a distance twice as large as the pad interval in pad row 59. In this configuration example, signal pads are DQ pads 52a and 52b.

In this exemplary embodiment, as shown in FIG. 6A, VSSSA pad 51 is arranged on an axis that is parallel to the axis of pad row 59 and spaced apart from pad row 59 by a predetermined distance. The distance between pad row 59 and VSSSA pad 51 is set the same as the distance between DQ pads 52a and 52b shown in FIG. 6A. The distance between pad row 59 and VSSSA pad 51 is desirably twice or more as large as the pad interval of pad row 59. The distance between VSSSA pad 51 and the DQ pads is desirable equal to or larger than the interval between DQ pads 52a and 52b shown in FIG. 6A.

In this exemplary embodiment, as in the first exemplary embodiment, a wire (not shown) connected to each of the plural pads arranged in pad row 59 is provided to extend to the right side in the figure with pad row 59 as a reference. A wire (not shown) connected to VSSSA pad 51 is provided to extend from the pad to the left side in the figure. Although detailed explanation concerning pads 57a to 57d is omitted, these pads may be signal pads.

In determining the pad arrangement of pad row 59, when the pads have to be arranged in order of DQ pad 52a, VSSSA pad 51, and DQ pad 52b, if there is room in an area of a region where pads are formed on chip 50, as in this exemplary embodiment, only VSSSA pad 51 needs to be arranged to be shifted from pad row 59.

In this exemplary embodiment, it is possible to prevent noise that occurs in the wire connected to the VSSSA pad from affecting the signal pads. Further, since the VSSSA pad is arranged on the axis different from the pad row in which the signal pads are arranged, the VSSSA pad and the signal pads are further apart from each other. Therefore, it is possible to prevent noise that occurs in the VSSSA pad from affecting the signal pads. It is also possible to prevent the noise from being propagated from the VSSSA pad to the signal pads.

Figure 6B:
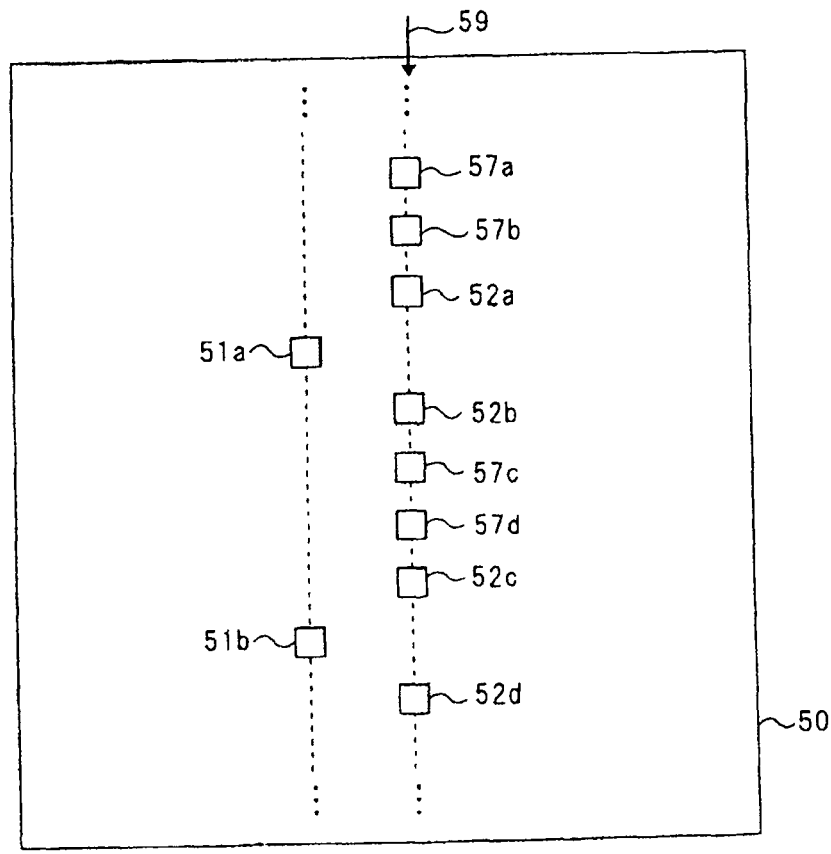
FIG. 6B is a plan view showing another configuration example of the pad arrangement in the semiconductor device of the second exemplary embodiment.

FIG. 6B is a plan view showing another configuration example of the pad arrangement in the semiconductor device of this exemplary embodiment. Plural VSSSA pads are arranged. VSSSA pads 51a and 51b are arranged on an axis that is parallel to pad row 59 and spaced apart from pad row 59 by a predetermined distance on the surface of chip 50 shown in FIG. 6B. In the following explanation, two VSSSA pads are provided. However, three or more VSSSA pads may be provided.

The distance between VSSSA pad 51a and DQ pad 52a and the distance between VSSSA pad 51a and DQ pad 52b are larger than the interval between DQ pads 52a and 52b shown in FIG. 6B. The distance between VSSSA pad 51b and DQ pad 52c and the distance between VSSSA pad 51b and DQ pad 52d are larger than the interval between DQ pads 52c and 52d shown in FIG. 6B.

When plural VSSSA pads are provided, as shown in FIG. 6B, only the VSSSA pads need to be arranged on an axis on the chip surface spaced apart from pad row 59 by a predetermined distance in a direction perpendicular to the axis of pad row 59. If the VSSSA pads are arranged in this way, it is unnecessary to substantially change the layout of wires that connect the internal circuit (not shown) and the VSSSA pads from the original layout.

Even when signal pads of any one of DM pads, DQS pads, and DQSB pads are adjacent to the VSSSA pads as DQ pads, as explained in this exemplary embodiment, only the VSSSA pads need to be arranged on the axis on the chip surface that is spaced apart from the pad row by the predetermined distance in the direction perpendicular to the axis of the pad row and is parallel to the pad row.

Example 4

Figure 7:
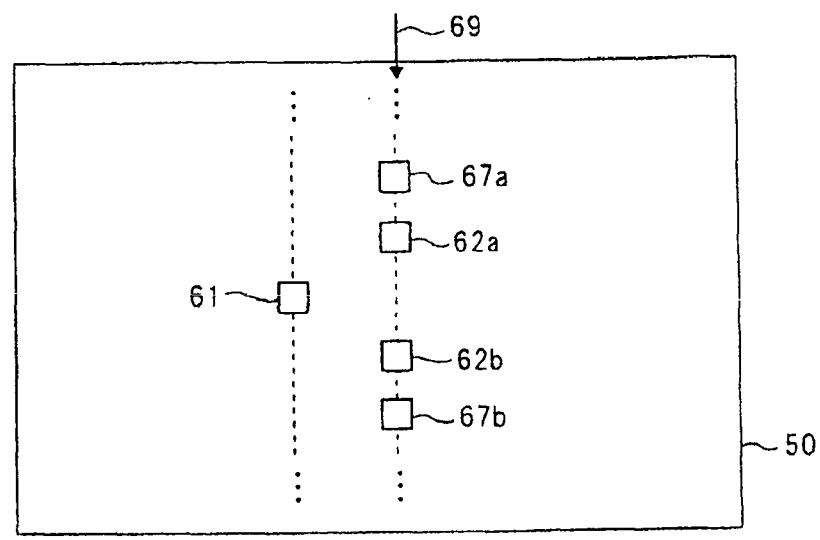
FIG. 7 is a plan view showing a configuration example of a pad arrangement of a semiconductor device of Example 4.

In Example 4, signal pads adjacent to a VSSSA pad are ADD pads. FIG. 7 is a plan view showing a configuration example of the pad arrangement of the semiconductor device of this example.

Pad row 69 is provided on the surface of chip 50 shown in FIG. 7. In pad row 69, pad 67a, ADD pad 62a, ADD pad 62b, and pad 67b are arranged in order from the top. The interval between ADD pad 62a and ADD pad 62b is twice as large as the interval among the other pads.

In this exemplary embodiment, as shown in FIG. 7, VSSSA pad 61 is arranged on an axis that is parallel to the axis of pad row 69 and spaced apart from pad row 69 by a predetermined distance. The distance between pad row 69 and VSSSA pad 61 is set the same as the interval between ADD pas 62a and 62b shown in FIG. 7. The distance between VSSSA pad 61 and the ADD pads is desirably equal to or larger than the interval between ADD pads 62a and 62b shown in FIG. 7.

In this exemplary embodiment, as in the first exemplary embodiment, a wire (not shown) connected to each of plural pads arranged in pad row 69 is provided to extend to the right side in the figure with pad row 69 as a reference. A wire (not shown) connected to VSSSA pad 61 is provided to extend from the pad to the left side in the figure. Although detailed explanation concerning pads 67a and 67b is omitted, these pads may be signal pads.

In determining the pad arrangement of pad row 69, when the pads have to be arranged in order of ADD pad 62a, VSSSA pad 61, and ADD pad 62b, if there is room in the area of a region where pads are formed on chip 50, as in this example, only VSSSA pad 61 needs to be arranged to be shifted from pad row 69.

Even if the signal pads are ADD pads as in this example, it is possible to prevent noise that occurs in the wire connected to the VSSSA pad from affecting the signal pads. Further, since the VSSSA pad is arranged on the axis that is different from the pad row in which the signal pads are arranged, the VSSSA pad and the signal pads are further apart from each other. Therefore, it is possible to prevent noise that occurs in the VSSSA pad from affecting the signal pads.

Even when the VSSSA pad is adjacent to any one signal pad from among a CMD pad, a CTRL pad, a CK pad, and a CKB pad, as explained in this example, only the VSSSA pad needs to be arranged on the axis on the chip surface that is spaced away from the pad row by the predetermined distance in the direction perpendicular to the axis of the pad row and is parallel to the pad row.

Example 5

Figure 8:
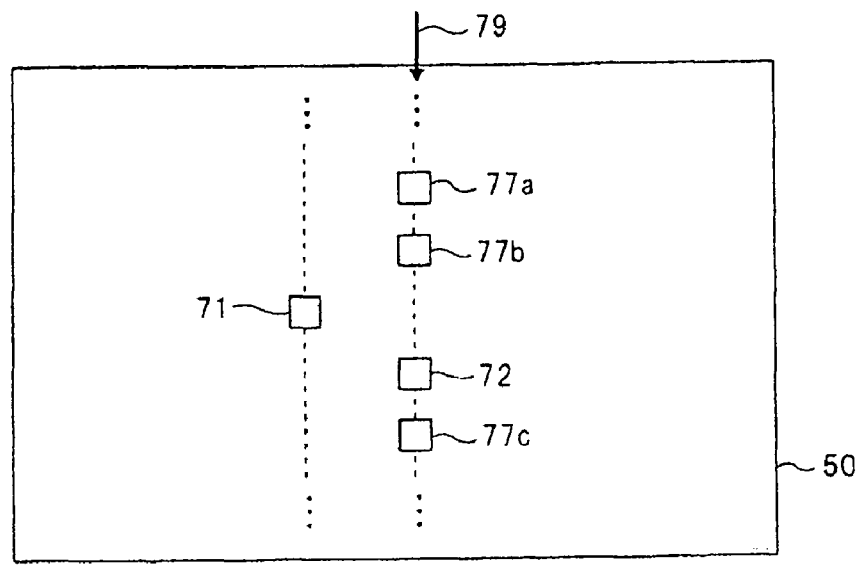
FIG. 8 is a plan view showing a configuration example of a pad arrangement of a semiconductor device of Example 5.

In Example 5, a VSSSA pad is adjacent to a VREF pad. FIG. 8 is a plan view showing a configuration example of the pad arrangement of the semiconductor device of this example.

Pad row 79 is provided on the surface of chip 50 shown in FIG. 8. In pad row 79, pad 77a, pad 77b, VREF pad 72, and pad 77c are arranged in order from the top. The interval between pad 77b and VREF pad 72 is twice as large as the interval among the other pads.

In this exemplary embodiment, as shown in FIG. 8, VSSSA pad 71 is arranged on an axis that is parallel to the axis of pad row 79 and spaced apart from pad row 79 by a predetermined distance. The distance between pad row 79 and VSSSA pad 71 is set the same as the interval between pad 77b and VREF pad 72 shown in FIG. 8. A distance between VSSSA pad 71 and VREF pad 72 is desirably equal to or larger than the interval between pad 77b and VREF pad 72 shown in FIG. 8.

In this exemplary embodiment, as in the first exemplary embodiment, a wire (not shown) connected to each of the plural pads arranged in pad row 79 is provided to extend to the right side in the figure with pad row 79 as a reference. A wire (not shown) connected to VSSSA pad 71 is provided to extend from the pad to the left side in the figure. Although detailed explanation concerning pads 77a to 77c is omitted, these pads may be signal pads.

In determining the pad arrangement of pad row 79, when the pads have to be arranged in order of VREF pad 72 and VSSSA pad 71, if there is room in the area of a region where pads are formed on chip 50, as in this example, only VSSSA pad 71 needs to be arranged to be shifted from pad row 79.

Even if a pad adjacent to the VSSSA pad is a constant voltage pad for supplying constant voltage having a voltage margin smaller than that of the power supply voltage, as in this example, it is possible to prevent noise that occurs in the wire connected to the VSSSA pad from affecting the constant voltage pad. Further, since the VSSSA pad is arranged on an axis that is different from the pad row in which the constant voltage pad is arranged, the VSSSA pad and the constant voltage pad are further apart from each other. Therefore, it is possible to prevent noise that occurs in the VSSSA pad from affecting the constant voltage pad.

Example 6

In Example 6, pads other than a VSSSA pad are arranged on an axis on which the VSSSA pad is arranged in the configuration shown in FIG. 6A.

Figure 9:
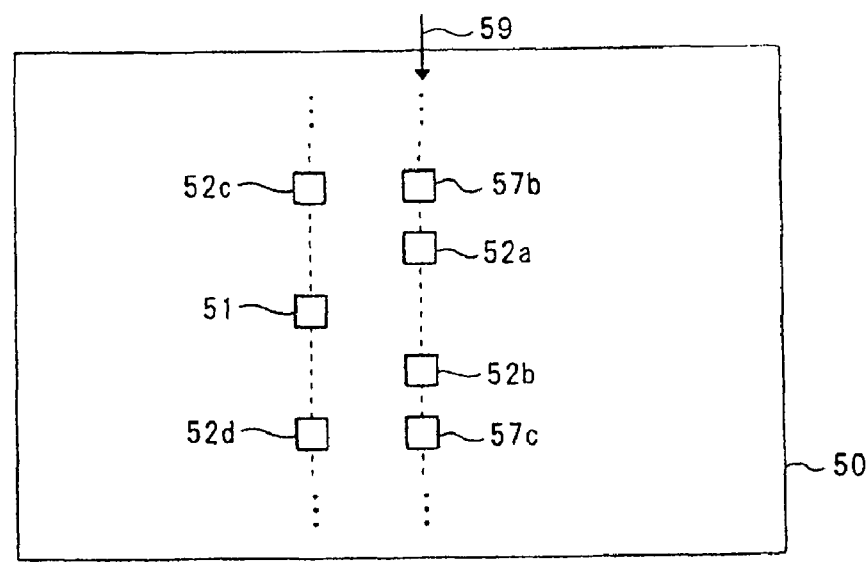
FIG. 9 is a plan view showing a configuration example of a pad arrangement of a semiconductor device of Example 6.

FIG. 9 is a plan view showing a configuration example of the pad arrangement of the semiconductor device of this example. In chip 50 shown in FIG. 9, besides pad row 59 and VSSSA pad 51 shown in FIG. 6A, DQ pads 52c and 52d as signal pads are provided. DQ pads 52c and 52d are arranged on the axis on which VSSSA pad 51 is provided.

The distance between VSSSA pad 51 and DQ pad 52c and the distance between VSSSA pad 51 and DQ pad 52d are set the same as the interval between DQ pads 52a and 52b shown in FIG. 9. The distance between VSSSA pad 51 and the DQ pads is desirably equal to or larger than the interval between DQ pads 52a and 52b shown in FIG. 9.

As in this example, other pads may be arranged on the axis on which the VSSSA pad is arranged.

In all of the exemplary embodiments and the examples explained above, a first conductive line connected to a pad for sense amplifier ground potential and a second conductive line connected to an electrode pad closest to the pad for sense amplifier ground potential extend in opposite directions with a pad row as a reference. Therefore, even if the two electrode pads are arranged close to each other, the second conductive line is not affected by noise that occurs in the first conductive line. Therefore, even if noise occurs because of fluctuation in ground potential voltage of the sense amplifier, it is possible to prevent malfunction of the semiconductor device.

Since a degree of freedom increases concerning arrangement of pads for sense amplifier ground potential, if the number of pads for sense amplifier ground potential is increased and the pads for sense amplifier ground potential are arranged at equal intervals, the effect of reducing noise is improved. Therefore, it is possible not only to cause the semiconductor device to operate at lower voltage but also to perform high-speed operation for signal detection.

It is apparent that the present invention is not limited to the above embodiments, but may be modified and changed without departing from the scope and spirit of the invention.

What is claimed is:

1. A semiconductor device comprising:
   plural memory cells;
   a sense amplifier that amplifies signal indicating information stored in one memory cell selected out of the plural memory cells;
   a pad row in which plural electrode pads are arranged along a fixed direction;
   a pad for sense amplifier ground potential as an electrode pad supplying ground potential voltage to the sense amplifier;
   a first conductive line connected to the pad for sense amplifier ground potential; and
   a second conductive line connected to an electrode pad closest to the pad for sense amplifier ground potential among the plural electrode pads included in the pad row, wherein
   the second conductive line extends to an opposite side of the first conductive line with the pad row as a reference, and
   the electrode pad connected to the second conductive line is a signal pad at least receiving input of a signal from the outside of the semiconductor device or outputting a signal to the outside of the semiconductor device.

2. The semiconductor device according to claim 1, wherein the pad for sense amplifier ground potential is arranged in the pad row, and
   the electrode pad connected to the second conductive line is an electrode pad arranged next to the pad for sense amplifier ground potential.

3. The semiconductor device according to claim 1, wherein the pad for sense amplifier ground potential is arranged on an axis that is parallel to an axis of the pad row and spaced apart from the pad row by a predetermined distance.

4. The semiconductor device according to claim 3, wherein the predetermined distance is twice or more as large as a pad interval in the pad row.

5. The semiconductor device according to claim 1, wherein the signal pad is an electrode pad that receives input of an address signal as a signal selecting one memory cell among the plural memory cells from the outside of the semiconductor device or an electrode pad that receives input of a signal from the outside of the semiconductor device at an operating frequency equal to that of the address signal.

6. The semiconductor device according to claim 1, wherein the signal pad is any one pad from among an electrode pad receiving input of data and outputting data, an electrode pad that receives input of a signal for setting whether data input is enabled, and an electrode pad inputting and outputting a signal as an operation reference of data input and output.

7. The semiconductor device according to claim 1, wherein the signal pad is an electrode pad inputting a clock signal as a reference in determining timing of input or output of various signals or a signal having potential opposite to that of the clock signal.

8. A semiconductor device comprising:
   plural memory cells;
   a sense amplifier that amplifies signal indicating information stored in one memory cell selected out of the plural memory cells;
   a pad row in which plural electrode pads are arranged along a fixed direction;

a pad for sense amplifier ground potential as an electrode pad supplying ground potential voltage to the sense amplifier;

a first conductive line connected to the pad for sense amplifier ground potential; and a second conductive line connected to an electrode pad closest to the pad for sense amplifier ground potential among the plural electrode pads included in the pad row, wherein the second conductive line extends to an opposite side of the first conductive line with the pad row as a reference, and the electrode pad connected to the second conductive line is a constant voltage pad that receives input of fixed voltage having a smaller margin of voltage fluctuation than power supply voltage applied to the semiconductor device.

9. The semiconductor device according to claim 8, wherein the fixed voltage is voltage lower than the power supply voltage and is a reference voltage to be supplied to the plural memory cells.

10. The semiconductor device according to claim 8, wherein the pad for sense amplifier ground potential is arranged in the pad row, and the electrode pad connected to the second conductive line is an electrode pad arranged next to the pad for sense amplifier ground potential.

11. The semiconductor device according to claim 8, wherein the pad for sense amplifier ground potential is arranged on an axis that is parallel to an axis of the pad row and spaced apart from the pad row by a predetermined distance.

12. The semiconductor device according to claim 11, wherein the predetermined distance is twice or more as large as a pad interval in the pad row.

13. A semiconductor device comprising:
plural memory cells;
an internal circuit;
a power supplying pad that supplies an operating voltage to the internal circuit;
a pad row in which plural electrode pads are arranged along a first direction, the pad row including first and second electrode pads disposed on both sides and immediately adjacent to the power supplying pad;
a first conductive line coupled to the power supplying pad; and
a second conductive line coupled to the first electrode pad and extended to an opposite side of the first conductive line with the pad row as a reference, wherein
the first and second electrode pads are signal pads at least receiving input of a signal from the outside of the semiconductor device or outputting a signal to the outside of the semiconductor device.

14. The semiconductor device according to claim 13, wherein the internal circuit includes a sense amplifier amplifying signal indicating information stored in a selected memory cell in the plural memory cells.

15. The semiconductor device according to claim 13, wherein the operating voltage includes a constant voltage.

16. The semiconductor device according to claim 13, wherein the power supplying pad is arranged on an axis that is parallel to an axis of the pad row and spaced apart from the pad row by a predetermined distance in a direction perpendicular to the first direction.

17. The semiconductor device according to claim 13, wherein the signal pads include an electrode pad that receives input of an address signal as a signal selecting one memory cell among the plural memory cells from the outside of the semiconductor device or an electrode pad that receives input of a signal from the outside of the semiconductor device at an operating frequency equal to that of the address signal.

18. The semiconductor device according to claim 13, wherein the signal pads include any one pad from among an electrode pad receiving input of data and outputting data, an electrode pad that receives input of a signal for setting whether data input is enabled, and an electrode pad inputting and outputting a signal as an operation reference of data input and output.

19. The semiconductor device according to claim 13, wherein the signal pads include an electrode pad inputting a clock signal as a reference in determining timing of input or output of various signals or a signal having potential opposite to that of the clock signal.

20. The semiconductor device according to claim 13, further comprising a third conductive line coupled to the second electrode pad and extended to the opposite side of the first conductive line with the pad rows as a reference.

* * * * *